(12) United States Patent
Bi et al.

(10) Patent No.: US 10,541,176 B2
(45) Date of Patent: *Jan. 21, 2020

(54) VERTICAL SILICON/SILICON-GERMANIUM TRANSISTORS WITH MULTIPLE THRESHOLD VOLTAGES

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/947,474

(22) Filed: Apr. 6, 2018

(65) Prior Publication Data
US 2018/0308764 A1    Oct. 25, 2018

Related U.S. Application Data

(63) Continuation of application No. 15/492,615, filed on Apr. 20, 2017, now Pat. No. 9,984,937.

(51) Int. Cl.
*H01L 29/66* (2006.01)
*H01L 21/8234* (2006.01)
*H01L 27/088* (2006.01)

(52) U.S. Cl.
CPC ........ *H01L 21/823487* (2013.01); *H01L 21/823412* (2013.01); *H01L 27/088* (2013.01); *H01L 29/66666* (2013.01)

(58) Field of Classification Search
CPC ....... H01L 21/823487; H01L 21/02164; H01L 21/02236; H01L 21/02255; H01L 21/2254;
(Continued)

(56) References Cited

U.S. PATENT DOCUMENTS 6,660,590 B2    12/2003 Yoo
6,846,709 B1    1/2005 Lojek
(Continued)

OTHER PUBLICATIONS

Office Action with cited art in corresponding U.S. Appl. No. 15/873,215 dated Sep. 27, 2018.
(Continued)

*Primary Examiner* — Tu-Tu V Ho
(74) *Attorney, Agent, or Firm* — Tutunjian & Bitetto, P.C.; Vazken Alexanian

(57) ABSTRACT

A method of forming vertical fin field effect transistors, including, forming a silicon-germanium cap layer on a substrate, forming at least four vertical fins and silicon-germanium caps from the silicon-germanium cap layer and the substrate, where at least two of the at least four vertical fins is in a first subset and at least two of the at least four vertical fins is in a second subset, forming a silicon-germanium doping layer on the plurality of vertical fins and silicon-germanium caps, removing the silicon-germanium doping layer from the at least two of the at least four vertical fins in the second subset, and removing the silicon-germanium cap from at least one of the at least two vertical fins in the first subset, and at least one of the at least two vertical fins in the second subset.

20 Claims, 9 Drawing Sheets

(58) Field of Classification Search
CPC ........... H01L 21/30604; H01L 21/3065; H01L 21/823412; H01L 21/823418; H01L 27/088; H01L 29/7855
USPC ........................................................ 257/329
See application file for complete search history.

(56) References Cited

U.S. PATENT DOCUMENTS

| | | | |
|---|---|---|---|
| 7,033,877 | B2 | 4/2006 | Chaudhry et al. |
| 8,901,537 | B2 * | 12/2014 | Murthy ............. H01L 21/28512 257/19 |
| 8,957,477 | B2 | 2/2015 | Chang et al. |
| 9,245,885 | B1 | 1/2016 | Xie et al. |
| 9,299,840 | B2 | 3/2016 | Xu |
| 9,425,196 | B1 | 8/2016 | Cheng et al. |
| 9,614,077 | B1 | 4/2017 | Cheng et al. |
| 9,984,937 | B1 * | 5/2018 | Bi ................... H01L 21/823487 |
| 2014/0070322 | A1 | 3/2014 | Jacob et al. |
| 2016/0093535 | A1 | 3/2016 | Xu et al. |
| 2016/0104776 | A1 | 4/2016 | Ching et al. |
| 2016/0247731 | A1 | 8/2016 | Balakrishnan et al. |
| 2017/0207216 | A1 | 7/2017 | Peng et al. |
| 2017/0033106 | A1 | 12/2017 | Walke et al. |
| 2018/0130895 | A1 | 5/2018 | Park et al. |

OTHER PUBLICATIONS

Disclosed Anonymously, "Vertical Double Gate Transistors for Multi-Vt FinFET Applications", IP.com Prior Art Database Technical Disclosure. May 7, 2012. pp. 1-6.
Disclosed Anonymously, "Evaluation of Ge Concentration using Lattice Deformation Measurement of SiGe FinFET", IP.com Prior Art Database Technical Disclosure. May 26, 2015. pp. 1-6.
Jiang et al., "Electrical Properties of GeSi Surface- and Buried-Channel P-MOSFET's Fabricated by Ge Implantation", IEEE Transactions on Electron Devices, vol. 43, No. 1. Jan. 1996. pp. 97-103.
Tanaka et al., "Abnormal oxidation characteristics of SiGe/Si-on-insulator structures depending on piled-up Ge fraction at SiO2/SiGe interface", Journal of Applied Physics. vol. 103, Issue 5. Mar. 12, 2008. pp. 1-6.
List of IBM Patents or Patent Applications Treated as Related dated Apr. 6, 2018, 2 pages, U.S. Appl. No. 15/492,615, filed Apr. 20, 2017, U.S. Appl. No. 15/873,215, filed Jan. 17, 2018, and present application.

* cited by examiner

VERTICAL SILICON/SILICON-GERMANIUM TRANSISTORS WITH MULTIPLE THRESHOLD VOLTAGES

BACKGROUND

Technical Field

The present invention generally relates to forming vertical transport fin field effect transistors (VT FinFETs) with multiple threshold voltages, and more particularly to forming VT FinFETs with different germanium concentration on the same substrate to provide threshold voltages.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (nFET) or a p-type FET (pFET) can be formed. An nFET and a pFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming vertical fin field effect transistors is provided. The method includes forming a silicon-germanium cap layer on a substrate, and forming at least four vertical fins and silicon-germanium caps from the silicon-germanium cap layer and the substrate, where at least two of the at least four vertical fins is in a first subset and at least two of the at least four vertical fins is in a second subset. The method further includes forming a silicon-germanium doping layer on the plurality of vertical fins and silicon-germanium caps. The method further includes removing the silicon-germanium doping layer from the at least two of the at least four vertical fins in the second subset. The method further includes removing the silicon-germanium cap from at least one of the at least two vertical fins in the first subset and at least one of the at least two vertical fins in the second subset.

In accordance with another embodiment of the present invention, a method of forming vertical fin field effect transistors with different threshold voltages is provided. The method includes forming a silicon-germanium cap layer on a substrate, wherein the silicon-germanium cap layer has a germanium concentration in the range of about 20 at. % to about 30 at. %. The method further includes forming at least four vertical fins and silicon-germanium caps from the silicon-germanium cap layer and the substrate, wherein at least two of the at least four vertical fins is in a first subset and at least two of the at least four vertical fins is in a second subset. The method further includes forming a silicon-germanium doping layer on the plurality of vertical fins and silicon-germanium caps, wherein the doping layer has a higher germanium concentration than the silicon-germanium cap layer. The method further includes removing the silicon-germanium doping layer from the at least two vertical fins in the second subset, and removing the silicon-germanium cap from at least one of the at least two vertical fins in the first subset and at least one of the at least two vertical fins in the second subset.

In accordance with yet another embodiment of the present invention, a plurality of vertical fin field effect transistors is provided. The plurality of vertical fin field effect transistors includes at least four vertical fins on a substrate, wherein at least two of the at least four vertical fins is in a first subset and at least two of the at least four vertical fins is in a second subset, and wherein four of the at least four vertical fins has a different germanium concentration from the other of the four vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to controlling the threshold voltage of vertical transport fin field effect transistors (VT FinFETs) by adjusting the concentration of germanium in the vertical fins forming the VT FinFET channels. The vertical fins can be intrinsic silicon or silicon-germanium.

Embodiments of the present invention also relate generally to forming different germanium sources on different vertical fins to control the final germanium concentrations in the vertical fins. Different configurations of germanium sources with different germanium concentrations can be used as doping sources, where the types of germanium sources in contact with each vertical fin can determine the final germanium concentration.

Embodiments of the present invention also relate generally to heat treating a set of vertical fins on a substrate to cause germanium to migrate from adjoining germanium sources into the vertical fins forming the VT FinFET channels. The vertical fins can be heat treated until the germanium concentration in each vertical fin reaches an equilibrium concentration.

Exemplary applications/uses to which the present invention can be applied include, but are not limited to: logic devices utilizing VT FinFETs.

It is to be understood that aspects of the present invention will be described in terms of a given illustrative architecture; however, other architectures, structures, substrate materials and process features and steps can be varied within the scope of aspects of the present invention.

Figure 1:
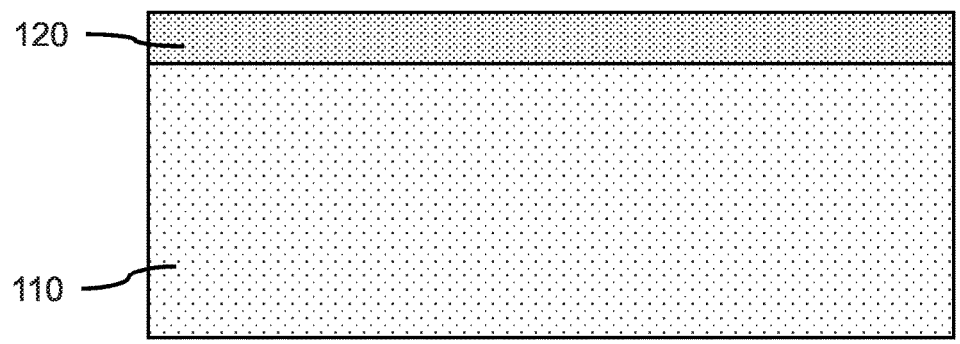
FIG. 1 is a cross-sectional view showing a silicon-germanium cap layer on a substrate surface, in accordance with an embodiment of the present invention.

Referring now to the drawings in which like numerals represent the same or similar elements and initially to FIG. 1, a silicon-germanium cap layer on a substrate surface is shown, in accordance with an embodiment of the present invention.

In one or more embodiments, a silicon-germanium cap layer 120 can be formed on the surface of a substrate 110, where the silicon-germanium cap layer 120 can be epitaxially grown on the substrate. The silicon-germanium cap layer 120 can have a germanium concentration in the range of about 10 at. % (atomic percent) to about 60 at. %, or in the range of about 20 at. % (atomic percent) to about 30 at. %, or about 25 at. %, although other concentrations are also contemplated. The silicon-germanium cap layer 120 can be can have a thickness in the range of about 3 nm to about 30 nm, or in the range of about 10 nm to about 30 nm, or in the range of about 10 nm to about 20 nm, although other thicknesses are also contemplated. The silicon-germanium cap layer 120 can be used to form silicon-germanium caps.

In various embodiments, the substrate 110 can be a semiconductor wafer or a wafer having a carrier layer, an insulating layer, and a semiconductor layer. In an embodiment, the substrate 110 can be a bulk silicon substrate (i.e., silicon wafer). In another embodiment, the substrate 110 can be a silicon-on-insulator (SOI) substrate.

Figure 2:
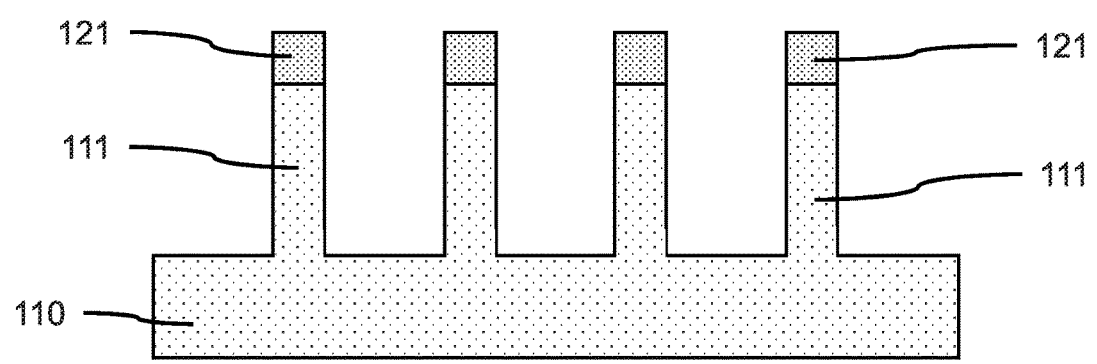
FIG. 2 is a cross-sectional view showing a silicon-germanium cap on each of a plurality of vertical fins, in accordance with an embodiment of the present invention.

FIG. 2 is a cross-sectional view showing a silicon-germanium cap on each of a plurality of vertical fins, in accordance with an embodiment of the present invention.

In one or more embodiments, vertical fins 111 and silicon-germanium caps 121 can be formed from the substrate 110 and silicon-germanium cap layer 120, where the vertical fins 111 and silicon-germanium caps 121 can be etched from the substrate 110 and silicon-germanium cap layer 120. A directional etch (e.g., a reactive ion etch (RIE)) can be used to remove material from the substrate. The vertical fins can each have the same width, height, and length.

In one or more embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a direct-write process, this is for descriptive purposes, since these other processes are also contemplated, and the scope of the claims and invention should not be limited to the particular illustrated features.

Figure 3:
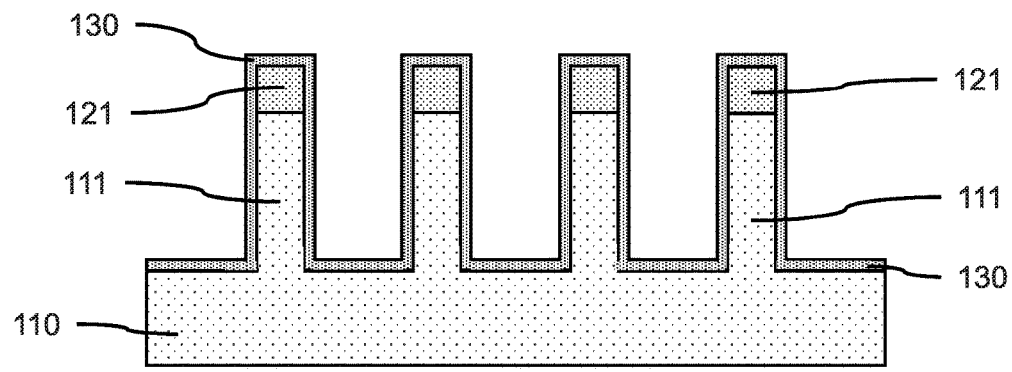
FIG. 3 is a cross-sectional view showing a doping layer on the silicon-germanium caps and vertical fins, in accordance with an embodiment of the present invention.

FIG. 3 is a cross-sectional view showing a doping layer on the silicon-germanium caps and vertical fins, in accordance with an embodiment of the present invention.

In one or more embodiments, a doping layer 130 can be formed on the silicon-germanium caps 121, vertical fins 111, and substrate surface. The doping layer 130 can be silicon-germanium (SiGe) having a higher germanium concentration than the silicon-germanium caps 121. In various embodiments, the doping layer 130 can have a germanium (Ge) concentration in the range of about 10 at. % to about 65 at. %, or in the range of about 35 at. % to about 65 at. %, or in the range of about 45 at. % to about 55 at. %, or about 50 at. %, although other concentrations are also contemplated. The doping layer 130 can have a thickness in the range of about 3 nm to about 10 nm, or in the range of about 5 nm to about 7 nm, although other thicknesses are contemplated. In various embodiments, the doping layer 130 can have a thickness that is less than or equal to ⅓ the distance between the facing vertical fin sidewalls, such that the two thicknesses of the doping layer 130 is less than ⅔ the distance between adjacent vertical fins, so the doping layer 130 and protective liner 140 fit between adjacent vertical fins. In various embodiments, the distance between adjacent vertical fins 111 can be in the range of about 15 nm to about 60 nm. The doping layer 130 can be formed by a conformal deposition to control the thickness.

In various embodiments, the range of the Ge concentration of the doping layer 130 and the range of the Ge concentration of the silicon-germanium cap layer 120 described above can be reversed, such that the silicon-germanium caps 121 have a higher germanium concentration than the doping layer 130.

Figure 4:
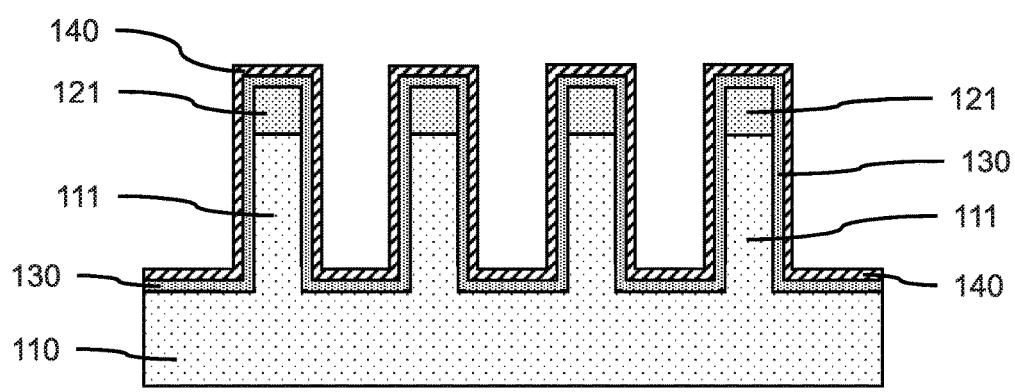
FIG. 4 is a cross-sectional view showing a protective liner on the doping layer, in accordance with an embodiment of the present invention.

FIG. 4 is a cross-sectional view showing a protective liner on the doping layer, in accordance with an embodiment of the present invention.

In one or more embodiments, a protective liner 140 on the doping layer 130. The protective liner 140 can act as an etch stop to prevent removal of the doping layer 130. The protective liner 140 can be silicon nitride (SiN). The protective liner 140 can be formed by a conformal deposition to control the thickness.

Figure 5:
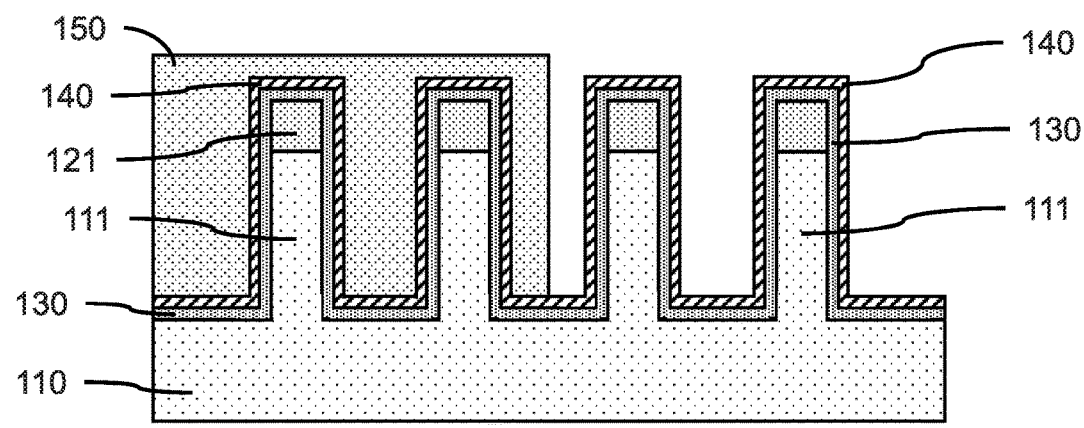
FIG. 5 is a cross-sectional view showing a cover layer masking a subset of the vertical fins in accordance with an embodiment of the present invention.

FIG. 5 is a cross-sectional view showing a cover layer masking a subset of the vertical fins in accordance with an embodiment of the present invention.

In one or more embodiments, a cover layer 150 can be formed on a portion of the substrate and vertical fins 111. The adjacent vertical fins 111 covered by the cover layer 150 can form a first subset and the exposed adjacent vertical fins can form a second subset. The cover layer 150 can be blanket deposited, and a predetermined portion of the cover layer 150 removed to expose a predetermined subset of the vertical fins 111. The cover layer 150 can be a flowable oxide or a polymeric material that can be spun on.

Figure 6:
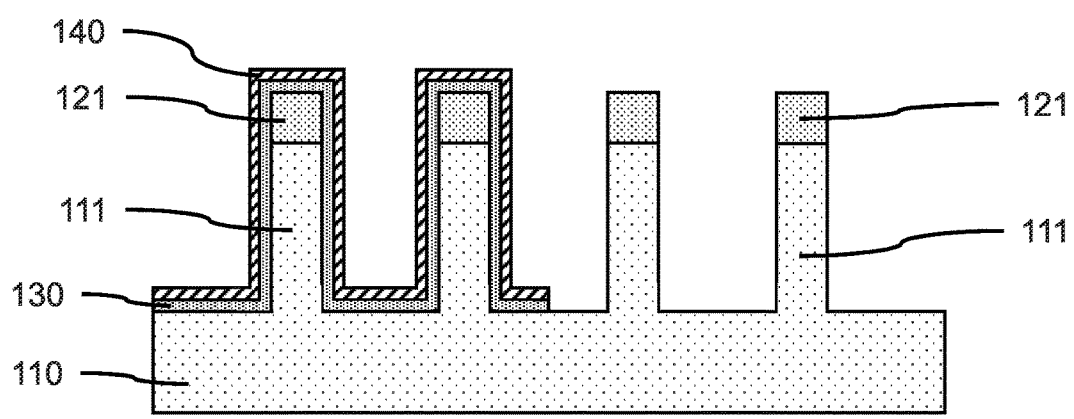
FIG. 6 is a cross-sectional view showing a subset of exposed vertical fins and silicon-germanium caps, in accordance with an embodiment of the present invention.

FIG. 6 is a cross-sectional view showing a subset of exposed vertical fins and silicon-germanium caps, in accordance with an embodiment of the present invention.

In one or more embodiments, the protective liner 140 can be removed from the exposed vertical fins to uncover the doping layer 130, and the doping layer can be removed to expose the vertical fins 111 and silicon-germanium caps 121. The protective liner 140 and doping layer 130 can be removed using selective etches. The exposed vertical fins can be of the second subset. The protective liner 140 and doping layer 130 can remain on the vertical fins of the first subset.

After removing the protective liner 140 and doping layer 130, the cover layer 150 can be removed to expose the first subset of vertical fins 111.

Figure 7:
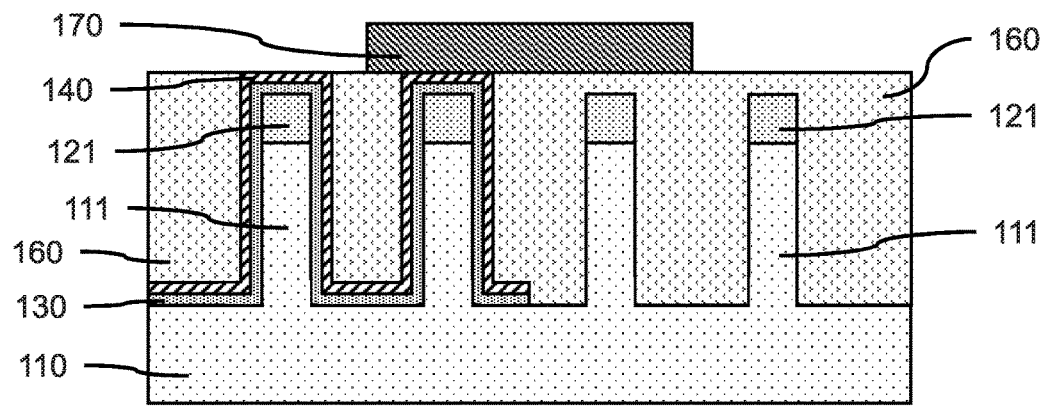
FIG. 7 is a cross-sectional view showing a mask and a fill layer, in accordance with an embodiment of the present invention.

FIG. 7 is a cross-sectional view showing a mask and a fill layer, in accordance with an embodiment of the present invention.

In one or more embodiments, a mask 170 and a fill layer 160 can be formed on the vertical fins 111 and substrate 110 to cover both the vertical fins 111 in the first subset and the vertical fins in the second subset. The fill layer 160 can be planarize by a chemical-mechanical polishing (CMP) to expose the top surfaces of the protective liner 140 on at least one vertical fin 111 in the first subset.

The mask 170 can be formed over one or more vertical fins of the first subset and one or more vertical fins of the second subset, such that at least one vertical fin 111 of the first subset is adjacent to a vertical fin 111 of the second subset. A selective, directional etch can be used to remove a portion of the protective liner 140 to expose the doping layer 130. The etch can remove a portion of the fill layer 160 around the exposed vertical fin of the first subset and the exposed vertical fin of the second subset. Removal of the fill layer 160 around the vertical fin of the second subset can expose the silicon-germanium cap 121. Another selective, directional etch can be used to remove the silicon-germanium cap 121 exposed by removal of the protective liner 140 to expose the top surface of the vertical fin 111. The selective etch can also remove the exposed silicon-germanium cap 121 on the vertical fin in the second subset.

Removal of the silicon-germanium cap 121 from predetermined vertical fins 111, and removal of the doping layer 130 from predetermined vertical fins can create a configuration of vertical fins having different germanium sources with different germanium concentrations on different vertical fins. A vertical fin 111 can have no germanium source, only a silicon-germanium cap 121 having a predetermined germanium concentration, only a doping layer 130 with a predetermined germanium concentration, or both a silicon-germanium cap 121 and a doping layer 130. The different configurations of germanium sources can provide for different germanium concentrations in the vertical fins 11 after diffusion. The vertical fins 111 can be intrinsic silicon, or the vertical fin can include an n-type or a p-type dopant.

Figure 8:
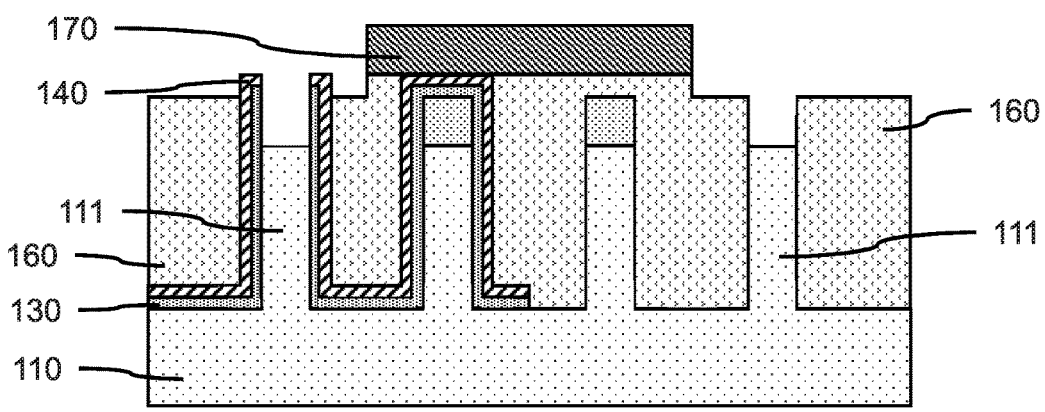
FIG. 8 is a cross-sectional view showing removal of predetermined silicon-germanium caps, in accordance with an embodiment of the present invention.

FIG. 8 is a cross-sectional view showing removal of predetermined silicon-germanium caps, in accordance with an embodiment of the present invention.

In one or more embodiments, the fill layer 160 and mask 170 can be removed after removal of the silicon-germanium caps 121 to expose the protective liner 140. The sidewalls of the vertical fins 111 of the second subset can be partially exposed. SiGe caps 121 can be removed by a selective etch, such as a wet etch process containing hydrogen peroxide ($H_2O_2$). Alternatively, SiGe caps can be removed by exposure to gas phase hydrogen chloride (HCl).

Figure 9:
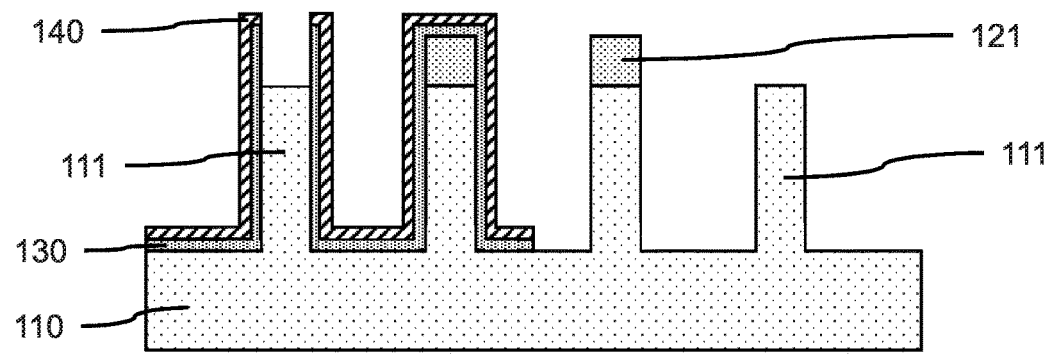
FIG. 9 is a cross-sectional view showing exposed vertical fins, in accordance with an embodiment of the present invention.

FIG. 9 is a cross-sectional view showing exposed vertical fins, in accordance with an embodiment of the present invention.

In one or more embodiments, the protective liner 140 can be removed to expose the underlying doping layer 130.

Figure 10:
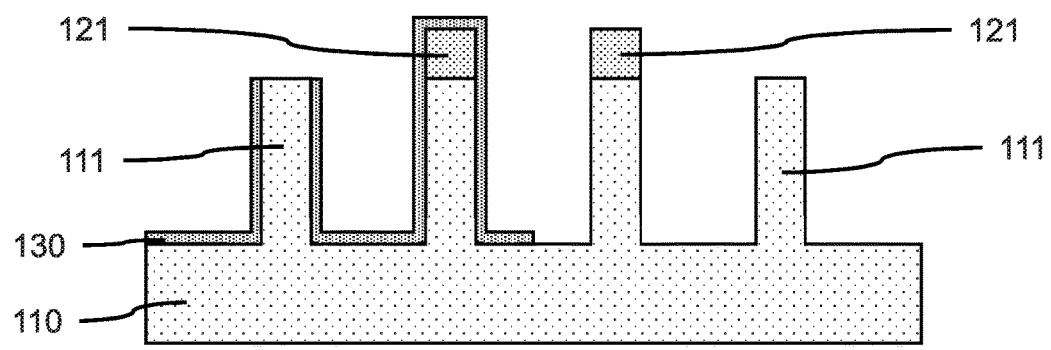
FIG. 10 is a cross-sectional view showing the doping layer on a subset of vertical fins, in accordance with an embodiment of the present invention.

FIG. 10 is a cross-sectional view showing the doping layer on a subset of vertical fins, in accordance with an embodiment of the present invention.

In one or more embodiments, the protective liner 140 and a portion of the doping layer 130 extending above the vertical fin 111 can be removed to leave the doping layer on the sidewalls of the vertical fin. Selective isotropic etching can be used to remove the protective liner 140.

Figure 11:
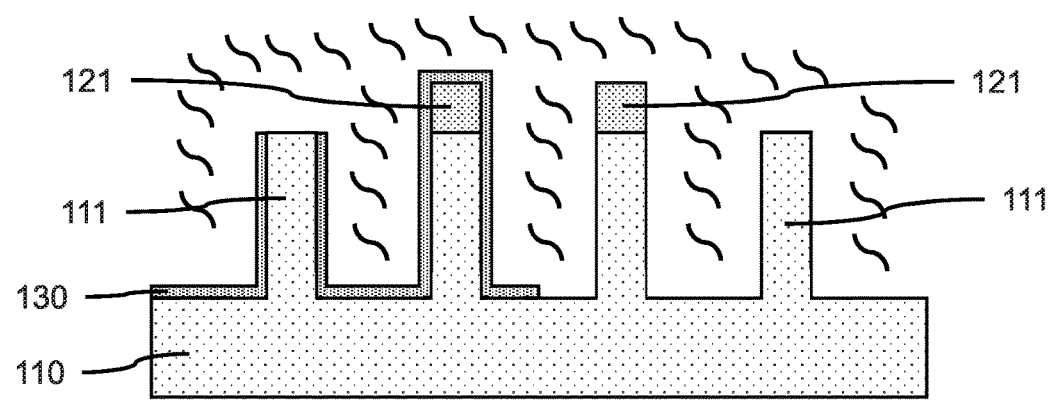
FIG. 11 is a cross-sectional view showing a heat treatment to diffuse germanium into the vertical fins, in accordance with an embodiment of the present invention.

FIG. 11 is a cross-sectional view showing a heat treatment to diffuse germanium into the vertical fins, in accordance with an embodiment of the present invention.

In one or more embodiments, a heat treatment can be used to diffuse the germanium from the germanium sources into the adjoining vertical fins 111 and substrate 110. The heat treatment can be at a suitable temperature and for a sufficient time for the germanium concentration in the vertical fins, doping layer 130 and silicon-germanium caps 121 to reach an equilibrium distribution in the vertical fins 111. The silicon-germanium of the doping layer 130 can diffuse into the surface of the substrate to form a bottom source/drain region 180. The heat treatment can be an annealing process at a temperature in the range of about 700° C. to about 1250° C., or in the range of about 800° C. to about 1100° C. The heat treatment can be for a time in the range of about 1 second to about 3600 seconds, or in the range of about 30 seconds to about 360 seconds.

In some embodiments, the annealing can be performed in vacuum. In some embodiments, the annealing is performed in an environment containing nitrogen, argon, helium, neon, hydrogen, oxygen, or any suitable combination of those gases. If oxygen is present during annealing, the annealing process is sometimes referred to as condensation process. In a condensation process, oxygen preferably reacts with silicon in silicon germanium to form silicon oxide (SiO) and repelling germanium into the vertical fins 111, effectively increasing germanium concentration in the vertical fins 111. Other suitable annealing conditions are also conceived.

Figure 12:
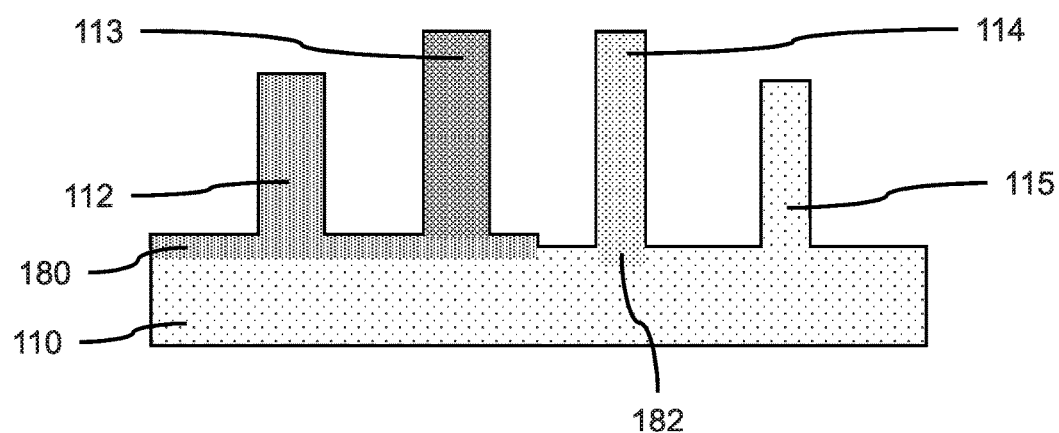
FIG. 12 is a cross-sectional view showing vertical fins with different concentrations of germanium, in accordance with an embodiment of the present invention.

FIG. 12 is a cross-sectional view showing vertical fins with different concentrations of germanium, in accordance with an embodiment of the present invention.

In one or more embodiments, the doping layer 130 and the vertical fins 111 can intermingle to cause the width of the vertical fins 111 to increase. Similarly, a portion of the silicon-germanium caps 121 can intermingle causing the heights of the vertical fins to increase. The vertical fins 111 can, thereby, have different dimensions after the heat treatment compared to the originally formed vertical fins 111. A portion of the germanium can migrate into the substrate to form a graded silicon-germanium bottom source/drain 182 below a silicon-germanium vertical fin.

The amount of germanium diffused into the vertical fin can depend on both the germanium concentration and the volume of the doping layer 130 and silicon-germanium caps 121, wherein a thicker doping layer 130 or thicker silicon-germanium cap 121 can provide a larger reservoir of germanium for diffusion into the vertical fin 111. The Ge concentration of a vertical fin can be related to the ratio of the volume of the vertical fin to the volume and germanium density of the germanium doping sources (doping layer 130 and/or silicon-germanium caps 121).

A vertical fin 112 formed from heat treatment of only a doping layer 130 can have a germanium concentration in the range of about 20 at. % to about 40 at. %, or in the range of about 25 at. % to about 30 at. %. The vertical fin 112 formed by diffusion of germanium from only a doping layer 130 can provide a threshold voltage, $Vt_1$, in the range of about 250 mV to about 450 mV, where the threshold voltage, $Vt_1$, is for a vertical fin field effect transistor fabricated with the vertical fin 112.

A vertical fin 113 formed from heat treatment of a doping layer 130 and a silicon-germanium cap 121 can have a germanium concentration in the range of about 40 at. % to about 60 at. %, or in the range of about 40 at. % to about 50 at. %, or about 50 at. % to about 60 at. %. The vertical fin 113 formed by diffusion of germanium from both a doping layer 130 and a silicon-germanium cap 121 can provide a threshold voltage, $Vt_2$, in the range of about 50 mV to about 250 mV, or in the range of about 50 mV to about 150 mV, where the threshold voltage, $Vt_2$, is for a vertical fin field effect transistor fabricated with the vertical fin 113.

A vertical fin 114 formed from heat treatment of only a silicon-germanium cap 121 can have a germanium concentration in the range of about 5 at. % to about 30 at. %, or in the range of about 10 at. % to about 20 at. %. The vertical fin 114 formed by diffusion of germanium from only a silicon-germanium cap 121 can provide a threshold voltage, $Vt_3$, in the range of about 300 mV to about 600 mV, or in the range of about 350 mV to about 550 mV, where the threshold voltage, $Vt_3$, is for a vertical fin field effect transistor fabricated with the vertical fin 114.

A vertical fin 115 not having either a doping layer 130 or a silicon-germanium cap 121 can have a germanium concentration of 0 at. % after heat treatment, or the germanium concentration of the substrate 110. The vertical fin 115 can provide a threshold voltage, Vt, in the range of about 600 mV to about 650 mV, or a threshold voltage, $Vt_4$, of 650 mV where the vertical fin has a germanium concentration of 0 at. %. Since vertical fin 115 does not have either a doping layer 130 or a silicon-germanium cap 121, heat treatment does not cause any Ge diffusion into vertical fin 115. Each of the vertical fins 111 with a germanium concentration greater than the intrinsic silicon vertical fin can provide a lower threshold voltage, wherein the threshold voltage, Vt, can be in the range of about 50 mV to about 650 mV for a germanium range of about 60 at. % to about 0 at. %. The threshold voltage can vary linearly with the germanium concentration, where the threshold voltage can change by 100 mV for each 10 at. % change in germanium concentration. An increase in Ge concentration decreases the threshold voltage, Vt. Induced strain in the vertical fins 111 can also cause an adjustment of the threshold voltage, Vt, where a total threshold voltage, $Vt_{tot}$, can be the combination of the threshold voltage shift due to the germanium concentration and a threshold voltage shift due to a strain imparted to the vertical fin 111. The threshold voltage shift due to an imparted strain can be in the range of about 1 mV to about 50 mV.

In various embodiments, the germanium concentration of vertical fin 114 can be greater than the germanium concentration of vertical fin 112, where the Ge concentration of the silicon-germanium cap 121 is greater than the Ge concentration of the doping layer 130, where the Ge concentration and the volume of the silicon-germanium cap 121 provides a greater Ge reservoir than the concentration and volume of the doping layer 130.

In a non-limiting exemplary embodiment, a silicon-germanium cap 121 can be formed on each of four fins, where the silicon-germanium cap 121 has a Ge concentration of 25 at. %. A doping layer 130 can be formed on each of four fins, where the doping layer 130 has a Ge concentration of 50 at. %. After heat treatment, the vertical fins 111 can have a Ge concentration in the range of about 5 at. %. to about 60 at. %.

Figure 13:
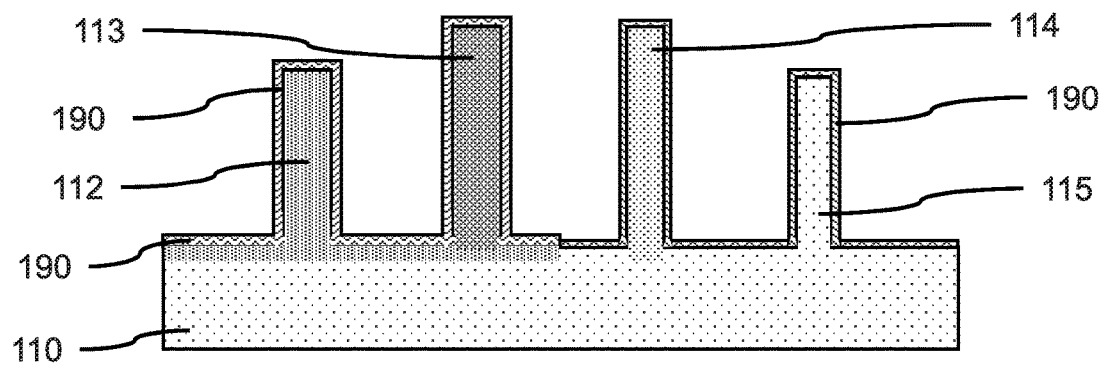
FIG. 13 is a cross-sectional view showing an oxidation trim to adjust vertical fin thicknesses, in accordance with an embodiment of the present invention.

FIG. 13 is a cross-sectional view showing an oxidation trim to adjust vertical fin thicknesses, in accordance with an embodiment of the present invention.

In one or more embodiments, the vertical fins 111 can be partially oxidized to trim excess material, and return the vertical fins 111 to more uniform dimensions. The vertical fins 111 can be exposed to an oxidizing atmosphere, where vertical fins having a higher germanium concentration are oxidized at a greater rate, so to a greater extent, than the vertical fins with a lower germanium concentration. The oxidation can also force germanium into the vertical fins to increase the remaining germanium concentration of the vertical fins 111. The oxidation can form an oxide layer 190 on the outer surfaces of the vertical fins 111 and substrate, particularly where the silicon-germanium formed bottom source/drain regions 180 at the surface of the substrate. The thickness of the oxide layer 190 can vary depending on the germanium concentration of the vertical fin, such that the thickness of the oxide layer 190 compensates for the difference in widths of the vertical fins depending on the germanium concentration. In various embodiments, the oxidation can be performed as part of the heat treatment described above through a condensation process. The oxidation also can be optional.

Figure 14:
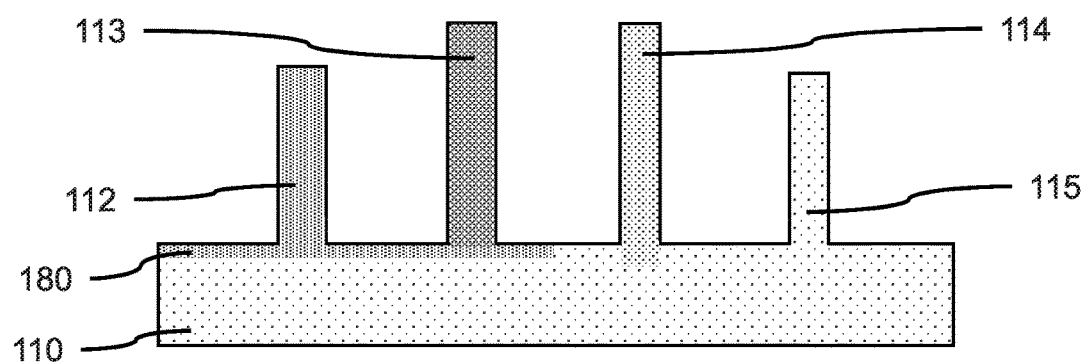
FIG. 14 is a cross-sectional view showing vertical fins with conformal thicknesses and varying germanium concentrations, in accordance with an embodiment of the present invention.

FIG. 14 is a cross-sectional view showing vertical fins with conformal thicknesses and varying germanium concentrations, in accordance with an embodiment of the present invention.

The oxide layer 190 can be removed from the outer surfaces of the vertical fins 111 and substrate 110 by a selective, isotropic etch. After removal of the oxide layer 190 the vertical fins 111 can have a width in the range of about 5 nm to about 15 nm, although other widths are contemplated.

Figure 15:
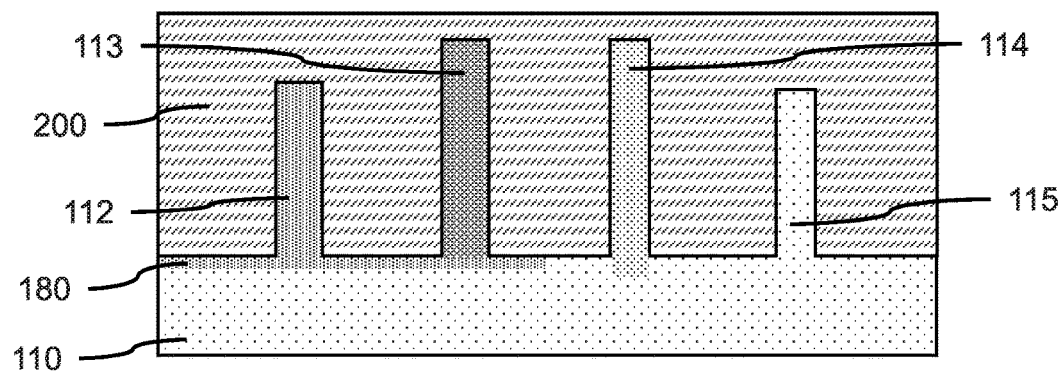
FIG. 15 is a cross-sectional view showing a planarization layer on the vertical fins, in accordance with an embodiment of the present invention.

FIG. 15 is a cross-sectional view showing a planarization layer on the vertical fins, in accordance with an embodiment of the present invention.

In one or more embodiments, a planarization layer 200 can be formed on the vertical fins 111, where the planarization layer 200 can be blanket deposited, and cover the top surfaces of a plurality of vertical fins 111. The planarization layer 200 can be a flowable oxide or a polymeric material. In various embodiments, the planarization can be optional.

Figure 16:
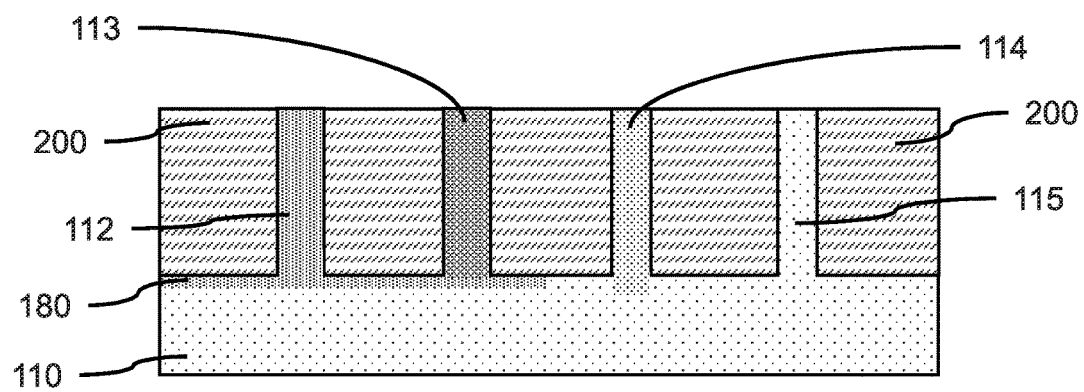
FIG. 16 is a cross-sectional view showing vertical fin with a uniform height, in accordance with an embodiment of the present invention.

FIG. 16 is a cross-sectional view showing vertical fin with a uniform height, in accordance with an embodiment of the present invention.

In one or more embodiments, a chemical-mechanical polishing (CMP) can be used to reduce the heights of each of the vertical fins 111 and the planarization layer 200 to a uniform height. In various embodiments, the vertical fins 111 can have a height in the range of about 20 nm to about 100 nm after planarization, or in the range of about 30 nm to about 60 nm, although other heights are also contemplated.

Figure 17:
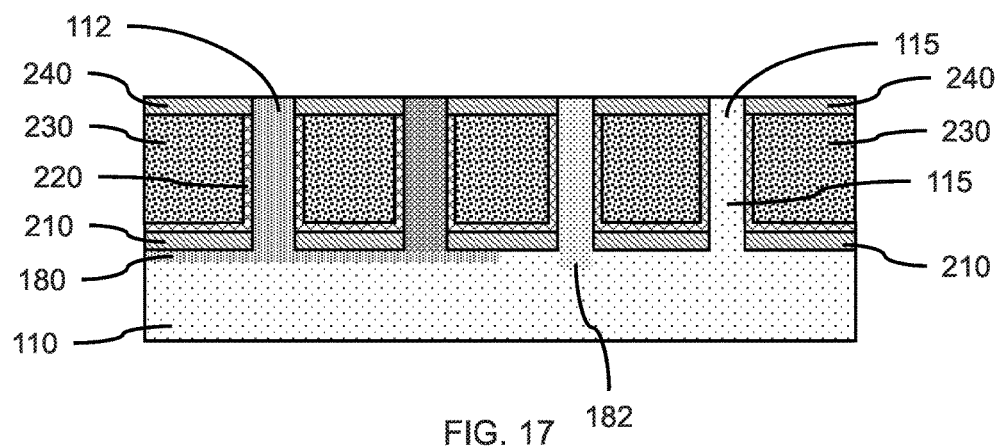
FIG. 17 is a cross-sectional view showing gate structures on the vertical fins, in accordance with an embodiment of the present invention.

FIG. 17 is a cross-sectional view showing gate structures on the vertical fins, in accordance with an embodiment of the present invention.

In one or more embodiments, the planarization layer 200 can be removed, for example, by a selective etch, and a gate structure can be formed on the exposed vertical fins 111. A bottom spacer layer 210 can be formed on the bottom source/drain regions 180, and bottom source/drain 182. The bottom spacer layer 210 can be directionally deposited, and an isotropic etch used to thin the bottom spacer layer and remove material from the sidewalls of the vertical fins 112, 113, 114, 115. The bottom spacer layer 210 can be an insulating dielectric material, for example, silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN), a low-k dielectric material, or a combination thereof.

A gate dielectric layer 220 can be formed on the bottom spacer layer 210 and sidewalls of the vertical fins 112, 113, 114, 115, where the gate dielectric layer 220 can be formed by a conformal deposition. The gate dielectric layer 220 can be an insulating dielectric material, for example, silicon oxide (SiO), silicon nitride (SiN), a high-k dielectric material, or a combination thereof.

A conductive gate electrode 230 can be formed on the gate dielectric layer 220, where the conductive gate electrode 230 can include a conductive gate fill and a work function layer between the conductive gate fill and the gate dielectric layer 220. The conductive gate fill can be a conductive metal, for example, tungsten, and the work function layer can be a metal carbide or metal nitride. The gate dielectric layer 220 and conductive gate electrode 230 form the gate structure on the vertical fins 112, 113, 114, 115.

A top spacer layer 240 can be formed on the gate structure to electrically isolate the conductive gate electrode 230 from top source/drains formed on the vertical fins. The top spacer layer can be directionally deposited and partially etched back. The top spacer layer 240 can be an insulating dielectric material, for example, silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN) a low-k dielectric material, or a combination thereof.

Figure 18:
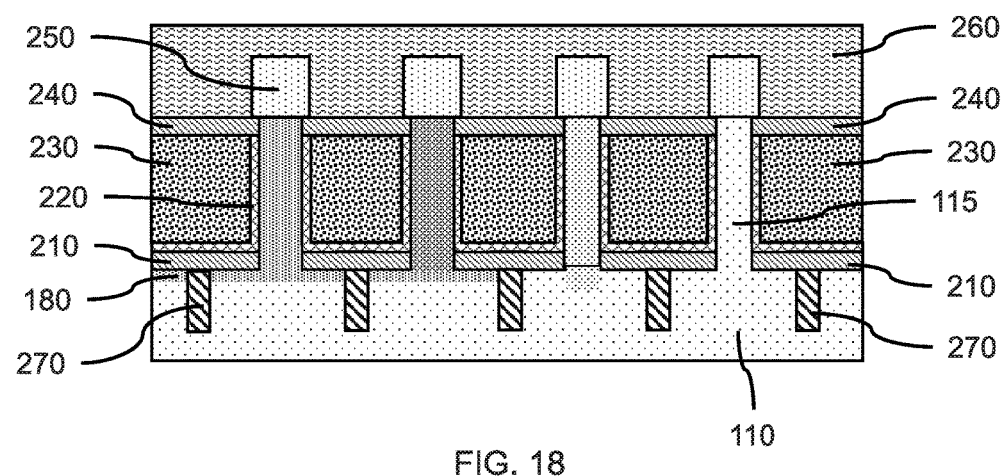
FIG. 18 is a cross-sectional view showing vertical transport fin field effect transistors, in accordance with an embodiment of the present invention.

FIG. 18 is a cross-sectional view showing vertical transport fin field effect transistors, in accordance with an embodiment of the present invention.

In one or more embodiments, top source/drains 250 can be formed on each of the vertical fins 112, 113, 114, 115, where the top source/drains 250 can be epitaxially grown on the vertical fins.

An interlayer dielectric (ILD) layer 260 can be formed on the top spacer layer 240 and the top source/drains 250. The ILD layer 260 can be silicon oxide (SiO). In various embodiments, the ILD layer can include a liner (e.g., silicon nitride, not shown) before a silicon oxide (SiO) deposition.

In various embodiments, isolation regions 270 can be formed between adjacent vertical fins 112, 113, 114, 115 to electrically separate the VT FinFETs formed from each of the vertical fins. The isolation regions 270 can be an insulating dielectric material, for example, silicon oxide (SiO), silicon nitride (SiN), silicon oxynitride (SiON), or any other suitable dielectric materials or suitable combination of those materials. Each vertical fin 112, 113, 114, and 115 can form a separate VT FinFET.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of vertical silicon/silicon-germanium transistors with multiple threshold voltages and fabrication methods thereof (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming vertical fin field effect transistors, comprising:
    forming a silicon-germanium cap layer on a substrate;
    forming a vertical fin with a silicon-germanium cap from the silicon-germanium cap layer and the substrate;
    forming a silicon-germanium doping layer on the vertical fin and silicon-germanium cap; and
    heat treating the vertical fin, silicon-germanium cap, and silicon-germanium doping layer to diffuse germanium into the vertical fin and substrate.

2. The method of claim 1, wherein the germanium concentration in the vertical fin resulting from heat treating is in a range of about 40 at. % to about 60 at. %.

3. The method of claim 2, wherein the germanium concentration in the vertical fin resulting from heat treating is in a range of about 50 at. % to about 60 at. %.

4. The method of claim 1, further comprising removing the silicon-germanium doping layer before heat treating.

5. The method of claim 4, wherein the germanium concentration in the vertical fin resulting from heat treating is in a range of about 5 at. % to about 30 at. %.

6. The method of claim 5, wherein the germanium concentration in the vertical fin resulting from heat treating is in a range of about 10 at. % to about 20 at. %.

7. The method of claim 1, further comprising removing the silicon-germanium cap from the vertical fin before heat treating.

8. The method of claim 7, wherein the germanium concentration in the vertical fin resulting from heat treating is in a range of about 20 at. % to about 40 at. %.

9. The method of claim 1, further comprising removing the silicon-germanium cap and the silicon-germanium doping layer from the vertical fin before heat treating.

10. The method of claim 9, wherein the germanium concentration in the vertical fin resulting from heat treating is the same as the initial germanium concentration of the substrate.

11. A method of forming vertical fin field effect transistors with different threshold voltages, comprising:
    forming a silicon-germanium cap layer on a substrate, wherein the silicon-germanium cap layer has a germanium concentration in the range of about 20 at. % to about 30 at. %;
    forming a vertical fin with a silicon-germanium cap from the silicon-germanium cap layer and the substrate; and
    forming a silicon-germanium doping layer directly on the exposed surfaces of the substrate, the vertical fin, and the silicon-germanium cap.

12. The method of claim 11, wherein the silicon-germanium doping layer has a germanium concentration in a range of about 35 at. % to about 65 at. %.

13. The method of claim 12, further comprising, forming a protective liner on the vertical fin and silicon-germanium cap, and removing a portion of the protective liner to expose the silicon-germanium cap, removing the silicon-germanium cap, and heat treating the vertical fin and silicon-germanium doping layer to diffuse germanium into the vertical fin and substrate.

14. The method of claim 12, further comprising removing the silicon-germanium cap and the silicon-germanium doping layer from the vertical fin.

15. The method of claim 14, further comprising heat treating the vertical fin.

16. A method of forming vertical fin field effect transistors, comprising:
    forming a silicon-germanium cap layer on a substrate;
    forming a vertical fin with a silicon-germanium cap from the silicon-germanium cap layer and the substrate;
    forming a silicon-germanium doping layer directly on the exposed surfaces of the substrate, vertical fin, and silicon-germanium cap; and
    forming a protective liner on the silicon-germanium doping layer and silicon-germanium cap.

17. The method of claim 16, further comprising, removing a portion of the protective liner and the silicon-germanium cap, and heat treating the vertical fin and silicon-germanium doping layer to diffuse germanium into the vertical fin and substrate.

18. The method of claim 16, further comprising removing the protective liner, and heat treating the vertical fin, silicon-germanium cap, and silicon-germanium doping layer to diffuse germanium into the vertical fin and substrate.

19. The method of claim 18, wherein the heat treating is conducted in an oxidizing atmosphere, wherein an oxide layer is formed on the vertical fin and substrate.

20. The method of claim 19, further comprising, removing the oxide layer from the outer surfaces of the vertical fin and substrate by a selective, isotropic etch.

* * * * *